(12) United States Patent
Sahota et al.

(10) Patent No.: US 6,770,523 B1
(45) Date of Patent: Aug. 3, 2004

(54) METHOD FOR SEMICONDUCTOR WAFER PLANARIZATION BY CMP STOP LAYER FORMATION

(75) Inventors: Kashmir S. Sahota, Fremont, CA (US); Jeffrey P. Erhardt, San Jose, CA (US); Arvind Halliyal, Cupertino, CA (US); Minh Van Ngo, Fremont, CA (US); Krishnashree Achuthan, San Ramon, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 12 days.

(21) Appl. No.: 10/190,397

(22) Filed: Jul. 2, 2002

(51) Int. Cl.$^7$ .................................. H01L 21/8238
(52) U.S. Cl. .................. 438/221; 438/359; 438/433; 438/692; 438/775
(58) Field of Search ................. 438/221, 294, 438/359, 424, 427, 433, 633–634, 743–744, 691–692, 756–757, 775–777, 783, 786–787

(56) References Cited

U.S. PATENT DOCUMENTS 6,221,734 B1 * 4/2001 Lin ............................. 438/424
2002/0098661 A1 * 7/2002 Cha et al. .................... 438/424
2002/0137306 A1 * 9/2002 Chen .......................... 438/430

* cited by examiner

Primary Examiner—Long Pham
Assistant Examiner—Ginette Peralta
(74) Attorney, Agent, or Firm—Mikio Ishimaru

(57) ABSTRACT

A method of manufacturing an integrated circuit is provided having a semiconductor wafer. A chemical-mechanical polishing stop layer is deposited on the semiconductor wafer and a first photoresist layer is processed over the chemical-mechanical polishing stop layer. The chemical-mechanical polishing stop layer and the semiconductor wafer are patterned to form a shallow trench and a shallow trench isolation material is deposited on the chemical-mechanical polishing stop layer and in the shallow trench. A second photoresist layer is processed over the shallow trench isolation material leaving the shallow trench uncovered. The uncovered shallow trench is then treated to become a chemical-mechanical polishing stop area. The shallow trench isolation material is then chemical-mechanical polished to be co-planar with the chemical-mechanical stop layer and the chemical-mechanical polishing stop treated area.

20 Claims, 5 Drawing Sheets

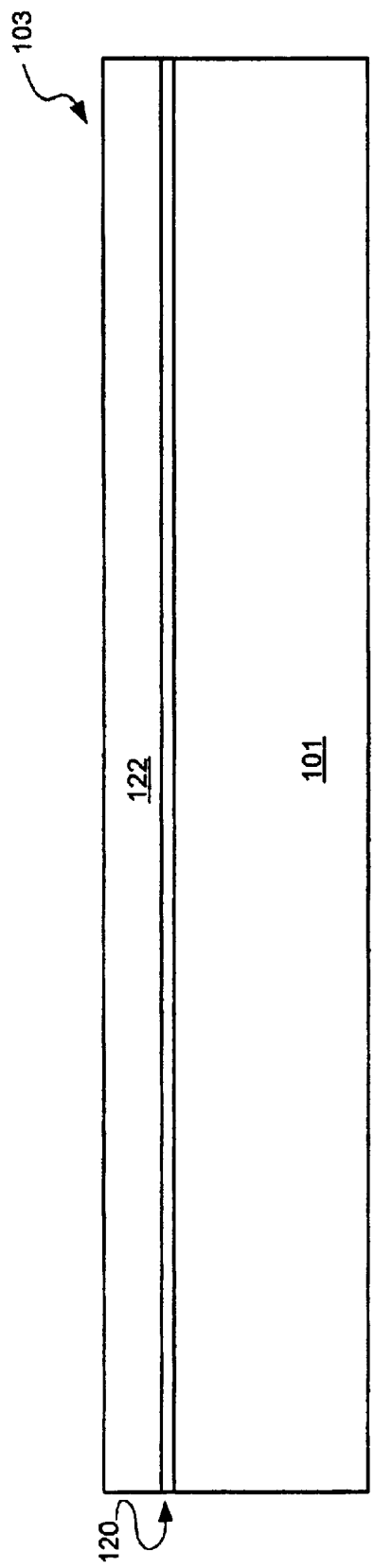
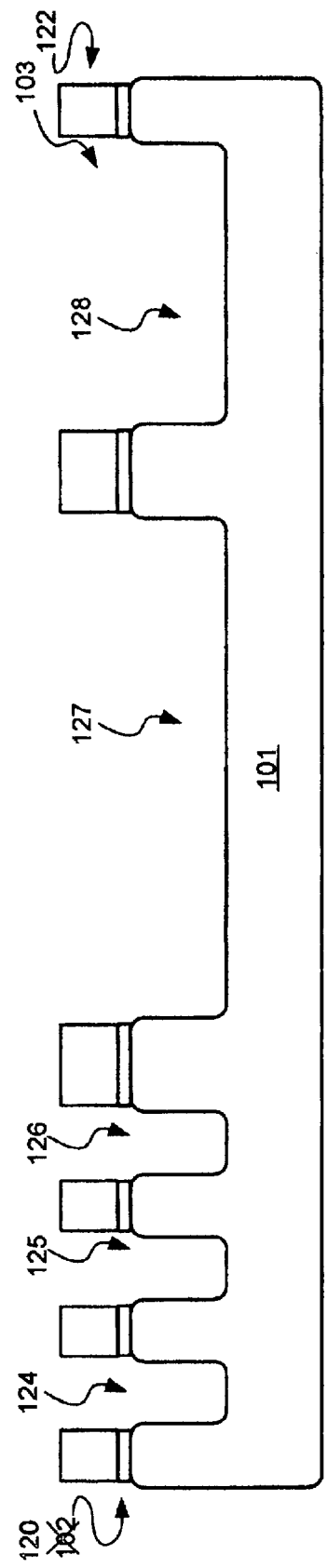

METHOD FOR SEMICONDUCTOR WAFER PLANARIZATION BY CMP STOP LAYER FORMATION

BACKGROUND OF THE INVENTION

1. Technical Field

The present invention relates generally to semiconductors and more specifically to an improved fabrication process for making semiconductor memory devices.

2. Background Art

Various types of memories have been developed in the past as electronic memory media for computers and similar systems. Such memories include electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lacks erasability.

A newer type of memory called "Flash" EEPROM, or Flash memory, has become extremely popular because it combines the advantages of the high density and low cost of EPROM with the electrical erasability of EEPROM. Flash memory can be rewritten and can hold its contents without power. It is used in many portable electronic products, such as cell phones, portable computers, voice recorders, etc. as well as in many larger electronic systems, such as cars, planes, industrial control systems, etc.

In Flash memory, bits of information are programmed individually as in the older types of memory, such as dynamic random access memory (DRAM) and static random access memory (SRAM) memory chips. However, in DRAMs and SRAMs where individual bits can be erased one at a time, Flash memory must currently be erased in fixed multi-bit blocks or sectors.

Conventionally, Flash memory is constructed of many Flash memory cells where a single bit is stored in each memory cell and the cells are programmed by hot electron injection and erased by Fowler-Nordheim tunneling. However, increased market demand has driven the development of Flash memory cells to increase both the speed and the density. Newer Flash memory cells have been developed that allow more than a single bit to be stored in each cell.

One memory cell structure involves the storage of more than one level of charge to be stored in a memory cell with each level representative of a bit. This structure is referred to as a multi-level storage (MLS) architecture. Unfortunately, this structure inherently requires a great deal of precision in both programming and reading the differences in the levels to be able to distinguish the bits. If a memory cell using the MLS architecture is overcharged, even by a small amount, the only way to correct the bit error would be to erase the memory cell and totally reprogram the memory cell. The need in the MLS architecture to precisely control the amount of charge in a memory cell while programming also makes the technology slower and the data less reliable. It also takes longer to access or "read"0 precise amounts of charge. Thus, both speed and reliability are sacrificed in order to improve memory cell density.

An even newer technology known as "MirrorBit®" Flash memory has been developed which allows multiple bits to be stored in a single cell. In this technology, a memory cell is essentially split into two identical (mirrored) parts, each of which is formulated for storing one of two independent bits. Each MirrorBit Flash memory cell, like a traditional Flash cell, has a gate with a source and a drain. However, unlike a traditional Flash cell in which the source is always connected to an electrical source and the drain is always connected to an electrical drain, each MirrorBit Flash memory cell can have the connections of the source and drain reversed during operation to permit the storing of two bits.

The MirrorBit Flash memory cell has a semiconductor substrate with implanted conductive bitlines. A. multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer perpendicular to the bitlines. Programming circuitry controls two bits per cell by applying a signal to the wordline, which acts as a control gate, and changing bitline connections such that one bit is stored by source and drain being connected in one arrangement and a complementary bit is stored by the source and drain being interchanged in another arrangement.

Programming of the cell is accomplished in one direction and reading is accomplished in a direction opposite that in which it is programmed.

All memory cells including the MirrorBit Flash memory cells are made up of multiple layers of material, which are deposited on a semiconductor substrate. At the same time that the memory cells are being built up in high-density core regions, they are surrounded by low-density peripheral regions containing transistors for input/output circuitry and programming circuitry which are also built up layer upon layer on the semiconductor substrate. The various memory cells in the core and the transistors in the circuit are separated by areas of shallow trench isolation, as well as the individual transistors being separated by shallow trench isolations, which are regions of an insulator such as silicon oxide deposited in trenches in the semiconductor substrate.

As the memory and transistor devices have been made smaller, it has been discovered that it is necessary to have an extremely planar surface of the semiconductor substrate with the shallow trench isolations. Unfortunately, it has been found that the current chemical-mechanical polishing (CMP) processes cause dishing or concavities in the tops of the shallow trench isolations, which are relatively broad. This dishing subsequently results in uneven planarization and detrimentally affects the integrated circuit as a whole.

A solution to this problem has been long sought but has long eluded those skilled in the art.

DISCLOSURE OF THE INVENTION

The present invention provides a method of manufacturing an integrated circuit having a semiconductor wafer with a chemical-mechanical polishing stop layer deposited thereon. A first photoresist layer is processed over the chemical-mechanical polishing stop layer and is patterned with the semiconductor wafer to form a shallow trench. A shallow trench isolation material is deposited on the chemical-mechanical polishing stop layer and in the shallow trench. A second photoresist layer is processed over the shallow trench isolation material leaving the shallow trench uncovered. The uncovered shallow trench is then treated to form a chemical-mechanical polishing stop layer. The shallow trench isolation material is then chemical-mechanical polished to be co-planar with the chemical-mechanical stop layer and the chemical-mechanical polishing stop treated area.

The above and additional advantages of the present invention will become apparent to those skilled in the art from a reading of the following detailed description when taken in conjunction with the accompanying drawings. dr

BEST MODE FOR CARRYING OUT THE INVENTION

Figure 1:
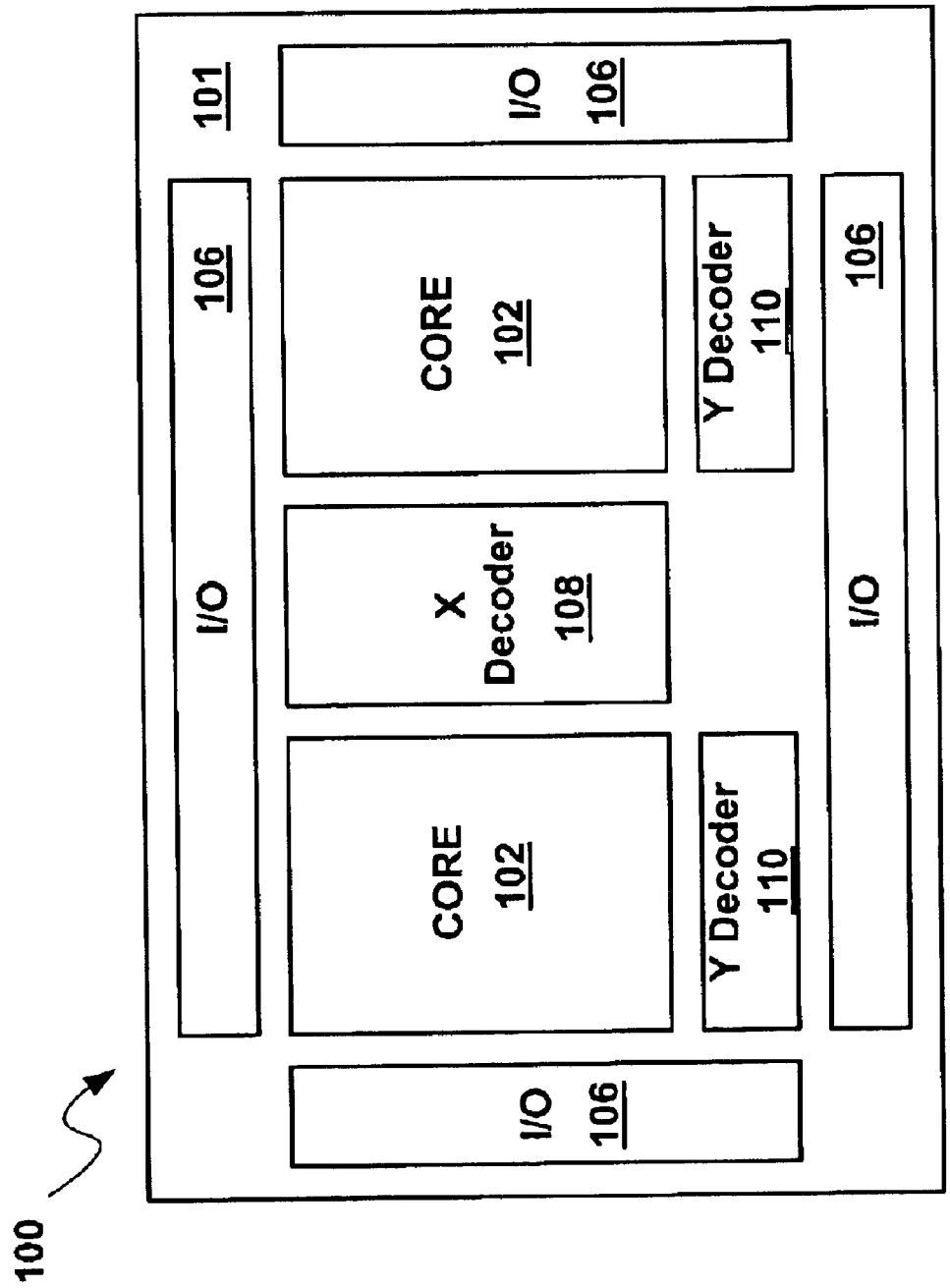
FIG. 1 is a plan view of a MirrorBit Flash EEPROM according to the present invention.

Referring now to FIG. 1, therein is shown a plan view of a MirrorBit® Flash EEPROM 100, which commonly includes a semiconductor substrate 101 in which one or more high-density core regions and one or more low-density peripheral portions are formed. The EEPROM 100 is manufactured according to the process of the present invention. High-density core regions typically include one or more M×N array cores 102 of individually addressable, substantially identical MirrorBit Flash memory cells. Low-density peripheral portions typically include input/output (I/O) circuitry and programming circuitry for selectively addressing the individual memory cells. The programming circuitry is represented in part by and includes one or more x-decoders 108 and y-decoders 110, cooperating with I/O circuitry 106 for connecting the source, gate, and drain of selected addressed memory cells to predetermined voltages or impedances to effect designated operations on the memory cell, e.g., programming, reading, and erasing, and deriving necessary voltages to effect such operations.

The term "horizontal" as used in herein is defined as a plane parallel to the conventional plane or surface of the semiconductor substrate 101 regardless of its orientation. The term "vertical" refers to a direction perpendicular to the horizontal as just defined. Terms, such as "on", "above", "below", "higher", "lower", "over", "under", "Thick", "side" and "beside", are defined with respect to these horizontal and vertical planes. The term "processed" as used herein is defined to include one or more of the following: depositing or growing semiconductor materials, masking, patterning, photolithography, etching, implanting, removal, and/or stripping.

Figure 2:
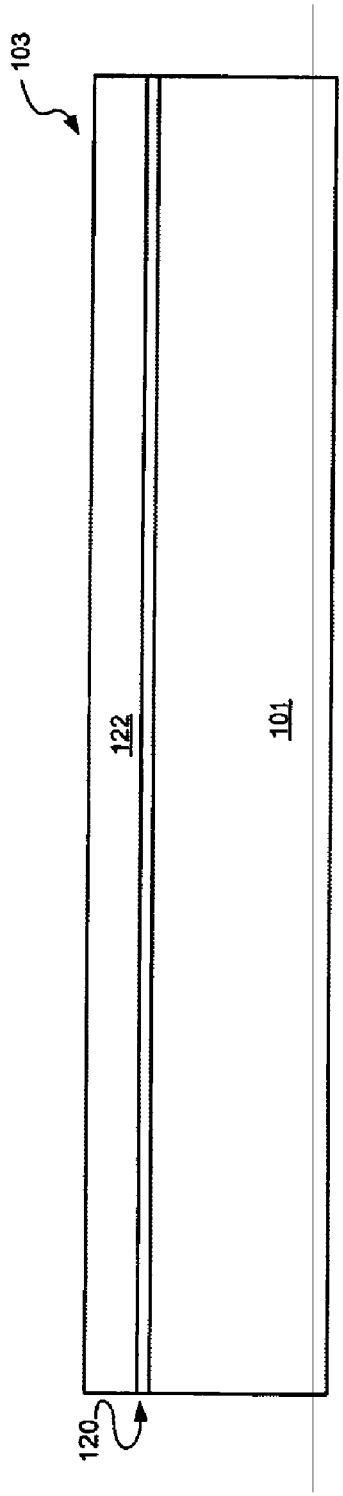
FIG. 2 is a cross-sectional view of a partially processed semiconductor wafer.

Referring now to FIG. 2, therein is shown a cross-sectional view of a partially processed semiconductor wafer 103. The semiconductor wafer 103 at this stage of processing includes the semiconductor substrate 101 of a material such as silicon and a chemical-mechanical polishing (CMP) stop layer 120. Over the CMP stop layer 120 is a first photoresist layer 122.

In current geometries, without being limiting, the CMP stop layer 120 is thin and should be less than 1000 Å (Angstroms) in thickness and preferably between 500 and 1000 Å. As would be evident, as memory devices are scaled down in size, even thinner layers would be desirable.

Figure 3:
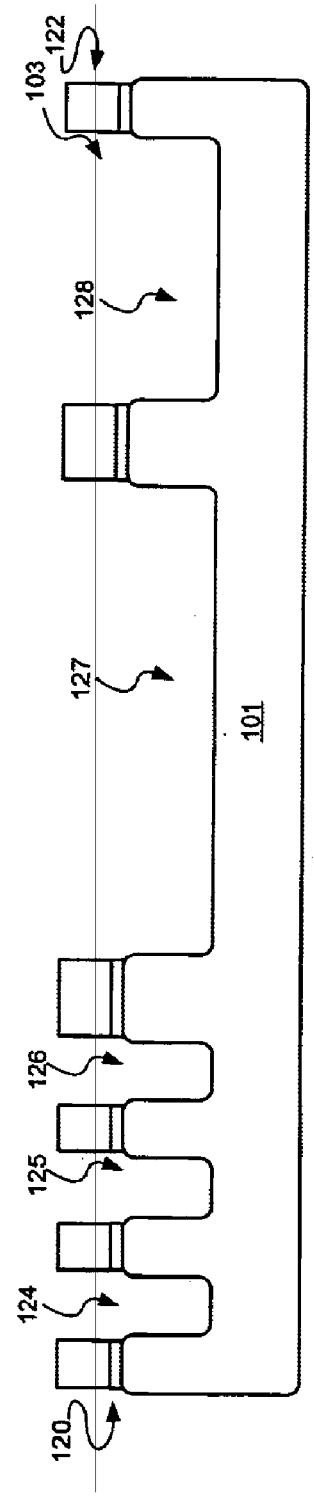
FIG. 3 is the structure of FIG. 2 after formation of the shallow trenches.
Figure 4:
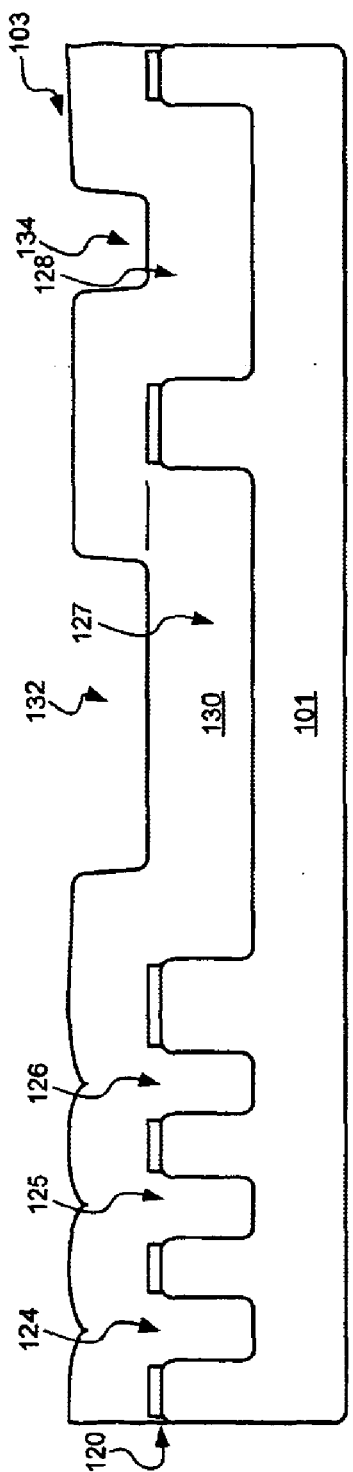
Figure 5:
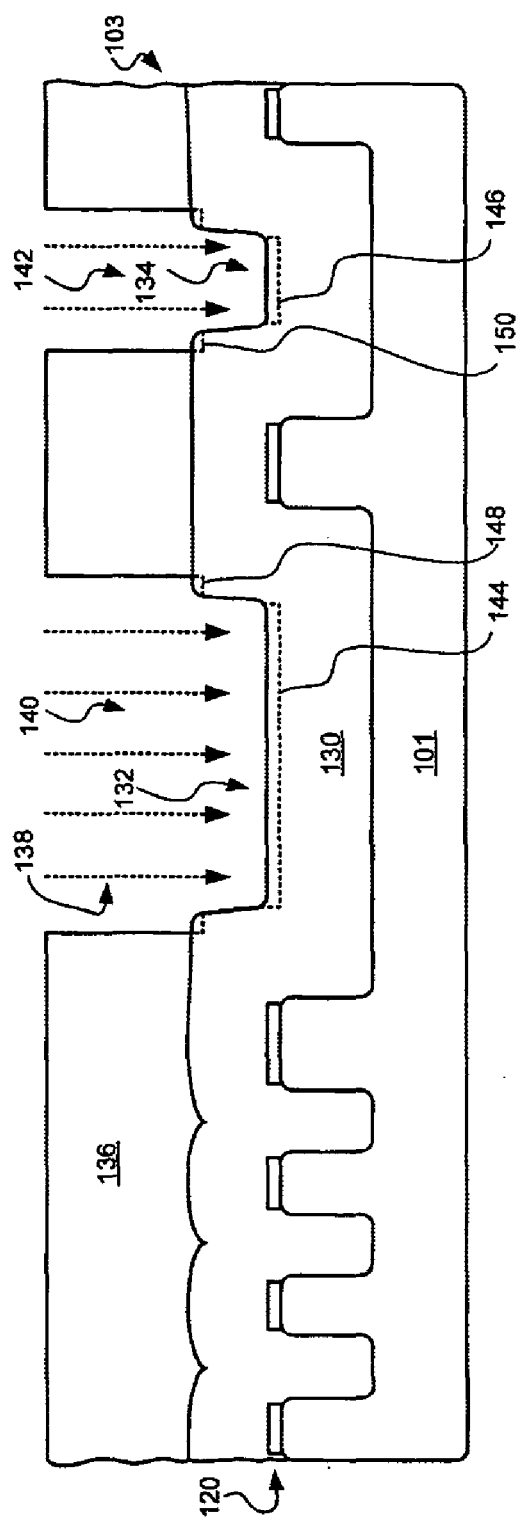

Referring now to FIG. 3, therein is shown the structure of FIG. 2 after formation of the shallow trenches. The first photoresist layer 122 has been conventionally processed, patterned, and removed to leave a patterned CMP stop layer 120 on the surface of the semiconductor substrate 101 and shallow trenches 124–128 having similar or different widths formed in the semiconductor substrate 101.

Figure 4:
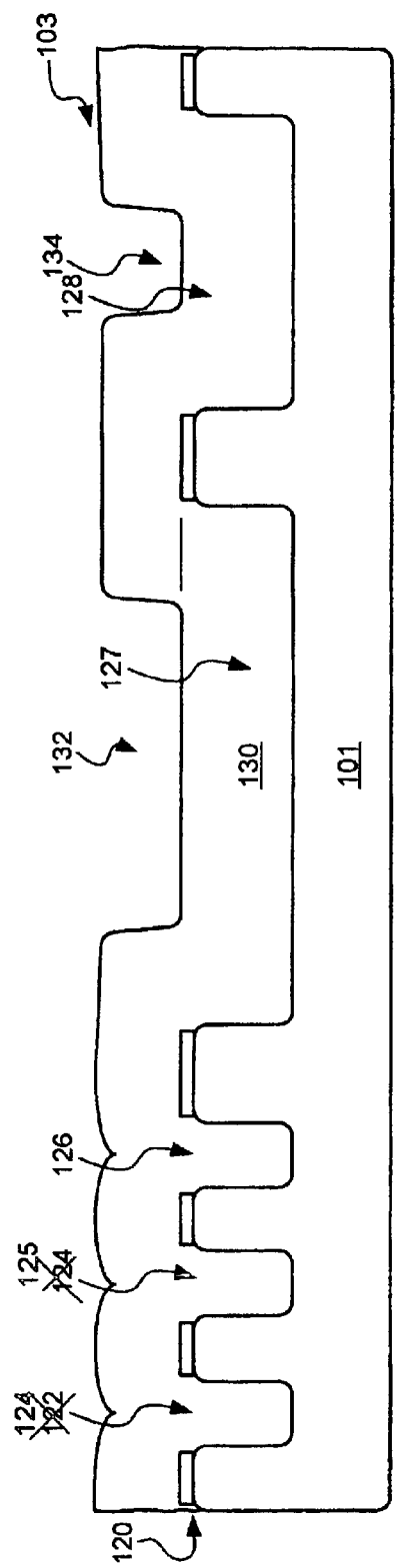
FIG. 4 is the structure of FIG. 3 after deposition of the insulation material on the wafer.

Referring now to FIG. 4, therein is shown the structure of FIG. 3 after deposition of a shallow trench insulation material 130 on the semiconductor wafer 103. Thus, the shallow trench isolation material 130 covers the patterned CMP stop layer 120 and is in the shallow trenches 124 through 128.

The shallow trench isolation material 130 should be relatively conformal so that, where the shallow trenches are close together, such as the shallow trenches 122 through 126, there is a fairly uniform thickness above the patterned CMP stop layer 120. However, where the shallow trenches are fairly wide, such as shallow trenches 127 and 128, there are conformal indentations 132 and 134 in the shallow trench isolation material 130. The thickness of the shallow trench isolation material 130 in the shallow trenches 127 and 128 makes the bottom of the conformal indentations 132 and 134 substantially coplanar with the top of the patterned CMP stop layer 120.

Figure 5:
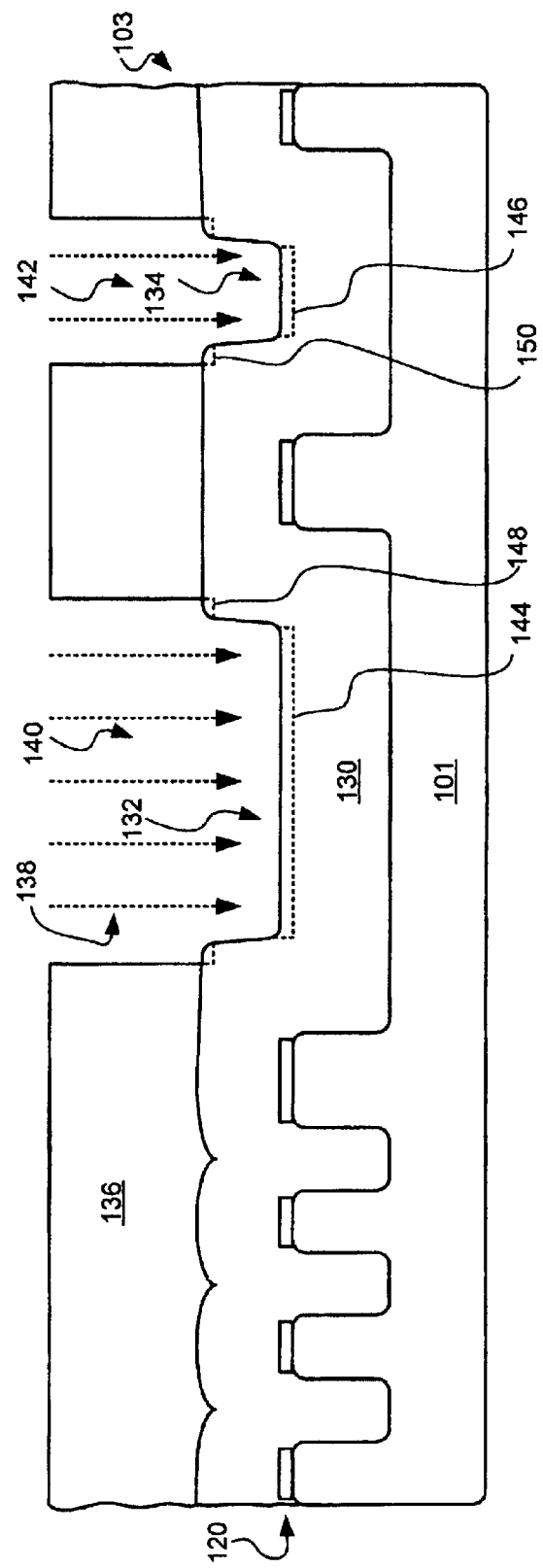
FIG. 5 is the structure of FIG. 4 after deposition and processing of a photoresist layer to form a reverse mask and treatment of the unmasked areas.

Referring now to FIG. 5, therein is shown the structure of FIG. 4 after deposition and processing of a second photoresist layer 136 to be a reverse pattern of the first photoresist layer 122 used to form the shallow trenches 124–128 but with the narrow shallow trenches 124 126 filled in a biased to so the widths of the wider trenches 127 and 128 are narrower as shown.

A CMP stop layer treatment 138 is applied through openings 140 and 142 of the second photoresist layer 136 into the bottoms of the conformal indentations 132 and 134 to form CMP stop treated areas 144 and 146, respectively.

It will be understood by those having ordinary skill in the art that CMP stop treated areas 148 and 150 outside the conformal indentations 132 and 134 will not have a substantial impact on the subsequent CMP process.

The CMP stop treated areas 144 and 146 can be formed by a number of different methods to be less than 1000 Å in thickness and preferably between 500 and 1000 Å.

Where a shallow trench isolation (STI) material will be silicon oxide, for example, the CMP stop layer 120 can be silicon nitride. The nitride is used because there is a selectivity of 5:1 for oxide to nitride, which means that five parts of oxide will be removed for every parts of nitride. For forming nitride CMP stop treated areas 144 and 146, the areas can be treated by:

1. a nitrogen implant;
2. a laser thermal anneal in a nitrogen ambient; or
3. a room temperature decoupled plasma nitriding (DPN).

Figure 6:
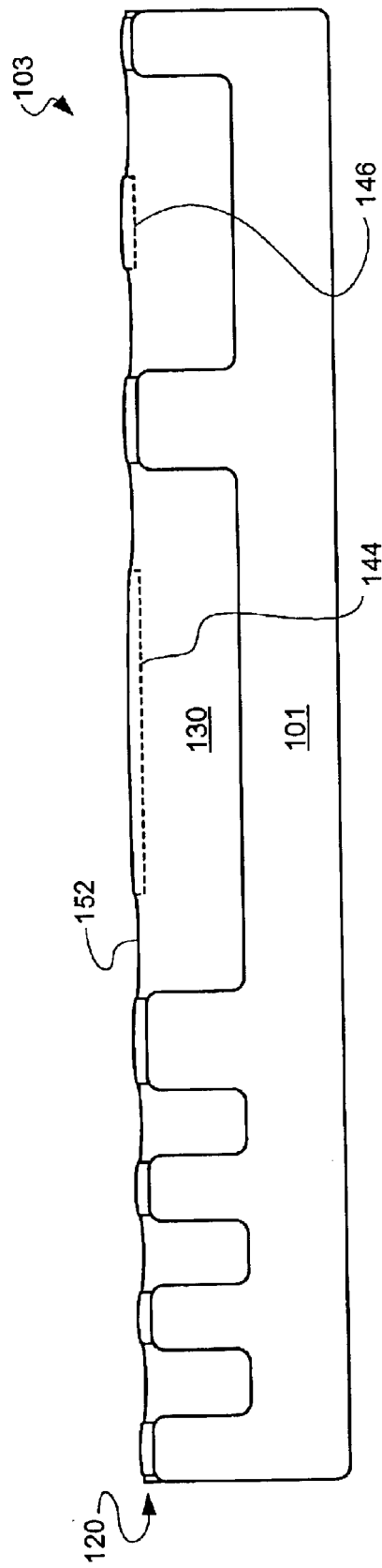
FIG. 6 is the structure of FIG. 5 after chemical-mechanical polishing.

Referring now to FIG. 6, therein is shown the structure of FIG. 5 after CMP. The CMP process will stop at the surface 152, which is essentially coplanar with the CMP stop layer 120 and the CMP stop treated areas 144 and 146. It has been discovered that the CMP process will slightly dish the shallow trench isolation material 130 while slightly reducing the thickness of the CMP stop layer 120.

Figure 7:
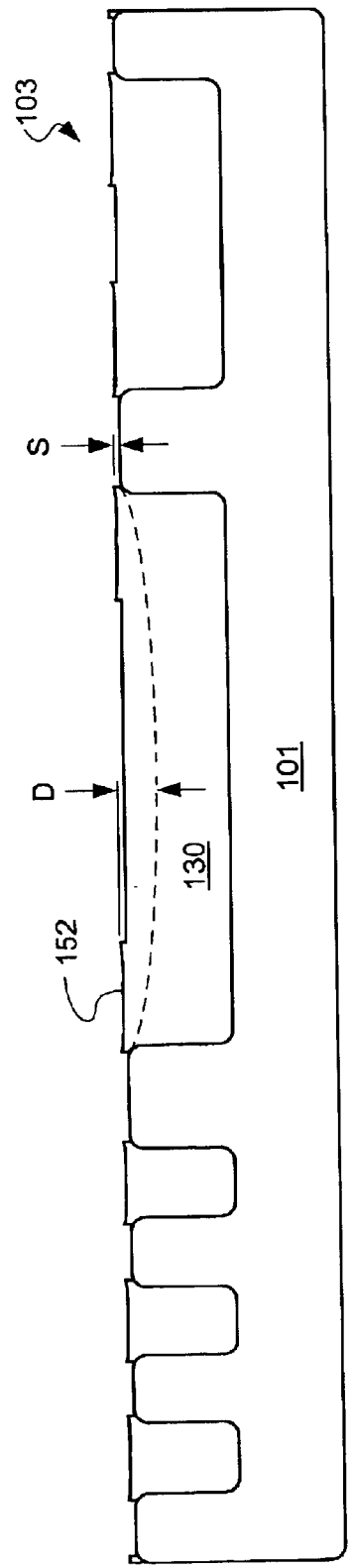
FIG. 7 is the structure of FIG. 6 after removal of a chemical-mechanical polishing stop layer.

Referring now to FIG. 7, therein is shown the structure of FIG. 6 after removal of the CMP stop layer 120 and the CMP stop treated areas 144 and 146. With the CMP stop layer 120 and the CMP stop treated areas 144 and 146 removed, the resulting semiconductor wafer 103 will be substantially planar such that the step "S" is below the thickness of the original CMP stop layer 120. The step "S" of the present invention is exaggerated in size as is the dishing "D" of the prior art to indicate both that there is some insignificant step "S" remaining and that "S" is much less than "D" in planarity.

With the present invention the post-polish CMP step "S" is insignificant with regard to subsequent depositions. A conventional hierarchy of process steps is used up until the shallow trench-fill deposition. After the shallow trench-fill deposition, the semiconductor wafer is masked using a reverse of the source/drain pattern. At this juncture, the photoresist layer protects all the active areas and the field areas are exposed. After masking, the semiconductor wafer is ion implanted with a shallow nitrogen implantation. With this implantation, the field areas have a shallow nitrogen-rich or silicon oxynitride layer. The photoresist layer is then removed and the semiconductor wafer sent to planarization. The CMP process can use a ceria-based slurry that is highly selective to nitride (the slurry has a high oxide removal rate compared to nitride) so that the oxide over the active areas can be easily polished. Due to the high selectivity of ceria-based slurry to nitride, on reaching the nitride or silicon nitride, polishing halts and yields a planar wafer. In this way, the process remains insensitive to any amount of overpolish and thus has a broad process margin. The nitride can then be stripped.

Figure 8:
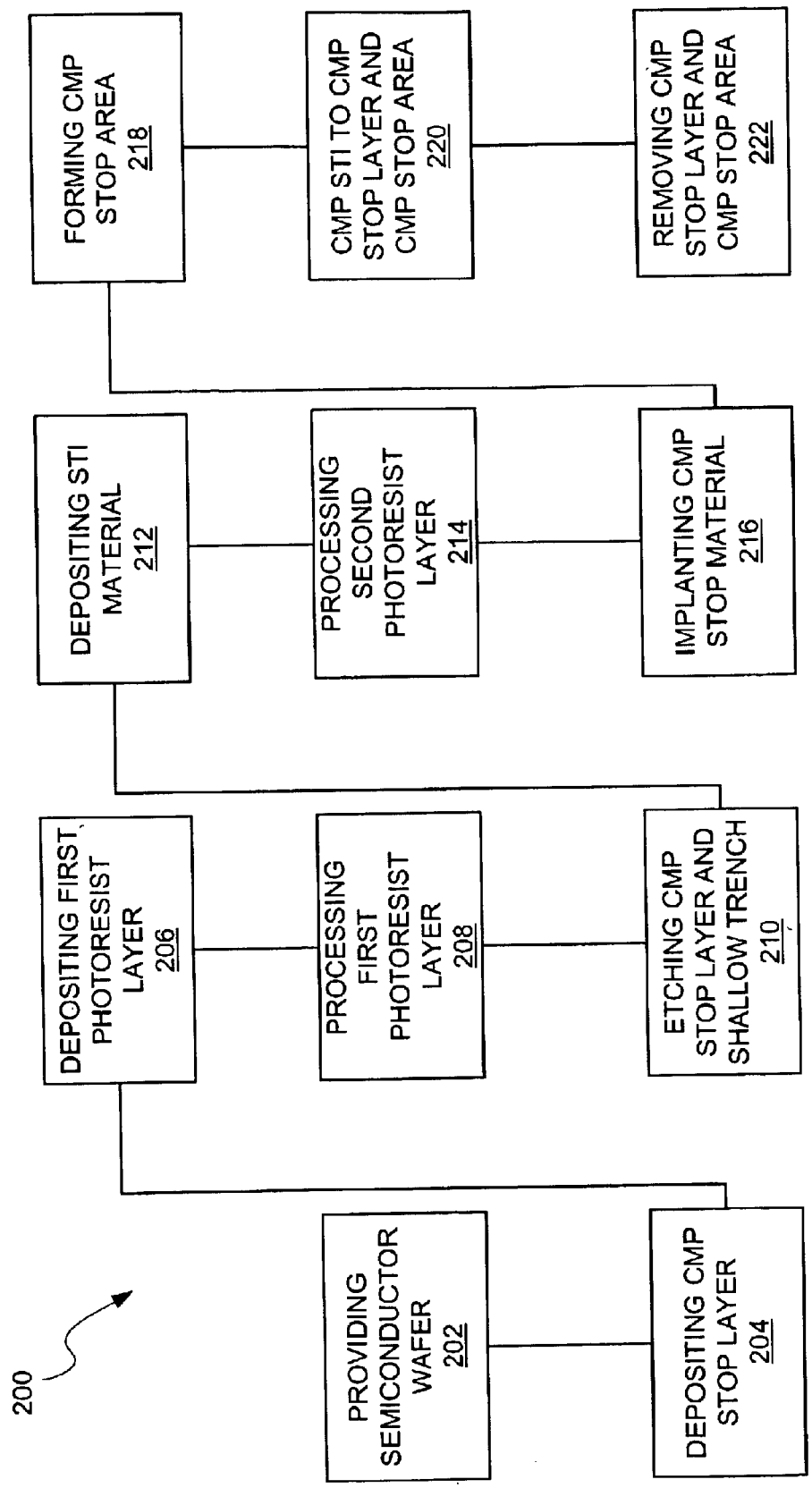
FIG. 8 is a simplified flow chart according to the present invention.

Referring now to FIG. 8, therein is shown a simplified flow chart 200 according to the present invention, which includes: providing semiconductor wafer 202; depositing CMP stop layer 204; depositing first photoresist layer 206; processing first photoresist layer 208; etching CMP stop layer and shallow trench 210; depositing STI material 212; processing second photoresist layer 214; implanting CMP stop layer 216; forming CMP stop treated area 218; CMP STI to CMP stop layer and CMP stop treated area 220; and removing CMP stop layer and CMP stop treated area 222.

Various implementations of the method may be used in different electronic devices and especially the dual bit memory cell architecture may be achieved according to one or more aspects of the present invention. In particular, the invention is applicable to memory devices wherein both bits in a dual bit cell are used for data or information storage.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hither-to-fore set forth or shown in the accompanying drawings are to be interpreted in an illustrative and non-limiting sense.

The invention claimed is:

1. A method of manufacturing an integrated circuit wafer comprising:

depositing a chemical-mechanical polishing stop layer on a semiconductor wafer;

processing a first photoresist layer over the chemical-mechanical polishing stop layer to form a patterned first photoresist layer;

processing to form a patterned chemical-mechanical polishing stop layer on the semiconductor wafer and to form a shallow trench in the semiconductor wafer using the patterned first photoresist layer;

depositing a shallow trench isolation material on the chemical-mechanical polishing stop layer and in the shallow trench;

processing a second photoresist layer to form a patterned second photoresist layer over the shallow trench isolation material and leaving uncovered shallow trench isolation material;

treating the uncovered shallow trench isolation material using the patterned second photoresist layer to form a chemical-mechanical polishing stop treated area; and chemical-mechanical polishing the shallow trench isolation material to be co-planar with the patterned chemical-mechanical polishing stop layer and the chemical-mechanical polishing stop treated area.

2. The method of manufacturing as claimed in claim 1 including removing the patterned chemical-mechanical polishing stop layer and chemical-mechanical polishing stop treated area.

3. The method of manufacturing as claimed in claim 1 wherein depositing the shallow trench isolation material deposits a conformal layer.

4. The method of manufacturing as claimed in claim 1 wherein depositing the shallow trench isolation material deposits a top surface of the uncovered shallow trench isolation material co-planar with the chemical-mechanical polishing stop layer.

5. The method of manufacturing as claimed in claim 1 wherein processing the second photoresist layer provides a reverse pattern of the patterned first photoresist layer.

6. The method of manufacturing as claimed in claim 1 wherein the treating of the shallow trench isolation material uses an implantation process.

7. The method of manufacturing as claimed in claim 1 wherein the treating of the shallow trench isolation material uses a laser thermal anneal.

8. The method of manufacturing as claimed in claim 1 wherein the treating of the hallow trench isolation material uses a room temperature decoupled plasma.

9. The method of manufacturing as claimed in claim 1 wherein depositing the hallow trench isolation material deposits an oxide.

10. The method of manufacturing as claimed in claim 1 wherein the chemical-mechanical polishing of the shallow trench isolation material uses a selective slurry which removes the shallow trench isolation material faster than the material of the chemical-mechanical polishing stop layer.

11. A method of manufacturing an integrated circuit wafer comprising:

providing a silicon wafer;

depositing a silicon nitride layer on a silicon wafer;

processing a first photoresist layer over the silicon nitride layer to form a patterned first photoresist layer;

processing to form a patterned silicon nitride layer on the semiconductor wafer and to form a plurality of shallow trenches in the semiconductor wafer using the patterned first photoresist layer;

depositing a silicon oxide on the silicon nitride layer and in the plurality of shallow trenches;

processing a second photoresist layer to form a patterned second photoresist layer over the silicon oxide and leaving a portion of the plurality of shallow trenches containing uncovered silicon oxide;

nitriding the uncovered silicon oxide using the patterned second photoresist layer to form a nitride treated area; and chemical-mechanical polishing the silicon oxide to be co-planar with the patterned silicon nitride layer and the nitride treated area.

12. The method of manufacturing as claimed in claim 11 including removing the patterned silicon nitride layer and nitride treated area.

13. The method of manufacturing as claimed in claim 11 wherein depositing the silicon oxide deposits a conformal layer.

14. The method of manufacturing as claimed in claim 11 wherein depositing the silicon oxide deposits a top surface of the uncovered silicon oxide co-planar with the silicon nitride layer.

15. The method of manufacturing as claimed in claim 11 wherein processing the second photoresist layer provides a reverse pattern of the patterned first photoresist layer.

16. The method of manufacturing as claimed in claim 11 wherein the treating the silicon oxide uses an implantation process.

17. The method of manufacturing as claimed in claim 11 wherein the treating of the silicon oxide uses a laser thermal anneal in a gaseous nitrogen containing ambient.

18. The method of manufacturing as claimed in claim 11 wherein the treating of the silicon oxide uses a room temperature decoupled plasma in a gaseous nitrogen containing ambient.

19. The method of manufacturing as claimed in claim 11 wherein the depositing of the silicon oxide deposits a high temperature silicon oxide.

20. The method of manufacturing as claimed in claim 11 wherein the chemical-mechanical polishing of the silicon oxide uses a ceria based slurry.

* * * * *

UNITED STATES PATENT AND TRADEMARK OFFICE
CERTIFICATE OF CORRECTION

PATENT NO. : 6,770,523 B1
DATED : August 3, 2004
INVENTOR(S) : Sahota et al.

It is certified that error appears in the above-identified patent and that said Letters Patent is hereby corrected as shown below:

Drawings,
Sheet 2 of 5, FIG. 3, see attached drawing sheet
Sheet 3 of 5, FIG. 4, see attached drawing sheet Column 1,
Line 61, delete "0" after the word "read"

Column 2,
Line 11, delete "." after the word "A"

Column 3,
Line 4, delete "dr" at the end of the paragraph
Lines 10 and 14, delete "wafer," and insert therefor -- wafer; --
Line 52, delete "Thick" and insert therefor -- "thick" --

Column 4,
Line 33, delete "124 126" and insert therefor -- 124 - 126 --
Line 33, delete "a" and insert therefor -- and --

Signed and Sealed this

Third Day of May, 2005

JON W. DUDAS
*Director of the United States Patent and Trademark Office*